United States Patent [19]

Lee

[11] Patent Number: 4,673,531

[45] Date of Patent: Jun. 16, 1987

[54] POLYCRYSTALLINE SILICON RESISTOR HAVING LIMITED LATERAL DIFFUSION

[75] Inventor: Ming-Kwang Lee, Hsin Chu, Taiwan

[73] Assignee: Industrial Technology Research Institute, Hsinchu, Taiwan

[21] Appl. No.: 864,555

[22] Filed: May 15, 1986

Related U.S. Application Data

[60] Continuation of Ser. No. 663,155, Oct. 22, 1984, abandoned, which is a division of Ser. No. 500,613, Jun. 3, 1983, Pat. No. 4,489,104.

[51] Int. Cl.[4] ............................................. H01B 1/06
[52] U.S. Cl. .................................... 252/512; 338/20; 428/901
[58] Field of Search ............ 252/512, 518; 29/610 R, 29/620, 625, 576 B, 577 C; 427/93, 96, 82, 185, 103, 123, 126, 383 B, 383 C; 338/20, 308; 428/901

[56] References Cited

PUBLICATIONS

Solid State Electronics, vol. 27, No. 11, pp. 995–1001, 1984, Lee et al.
Solid State Electronics, vol. 26, No. 7, pp. 657–665, 1983, Huang et al.
"Annealing Characteristics of Boron- and Phosphorus–Implanted Polycrystalline Silicon", Gen. Motors Corporation, pp. 5167–5170, 1976, Seto.
"Conduction Properties of Chemically Deposited Polycrystalline Silicon", Mitsubishi Electric Corporation, Yoshihara et al, pp. 1603–1607.
"Modern Microelectronic Circuit Design", vol. 1, M. Fogiel, 1981, pp. 334–336.
"Modeling and Optimization of Monolithic Polycrystalline Resistors", Lu et al, IEEE Transactions on Electronic Devices, vol. Ed-28, No. 7, Jul. 1981, pp. 818–830.

*Primary Examiner*—Josephine L. Barr
*Attorney, Agent, or Firm*—Bert J. Lewen; Henry Sternberg

[57] ABSTRACT

An improved polycrystalline silicon resistor having limited lateral diffusion, integrated circuits containing such resistors, and a method of their preparation is disclosed. The polysilicon resistor is formed by first doping the polysilicon layer with a p or n type impurity and thereafter neutralizing the treated layer with impurities of the other type so as to form a device wherein the concentration gradient between the resistor region of the aforesaid layer and its environment is low. The low concentration gradient reduces lateral diffusion during manufacture, thereby permitting manufacture of integrated circuits of higher circuit density and resistors with smaller dimensions, lower temperature coefficients and higher reliability.

4 Claims, 9 Drawing Figures

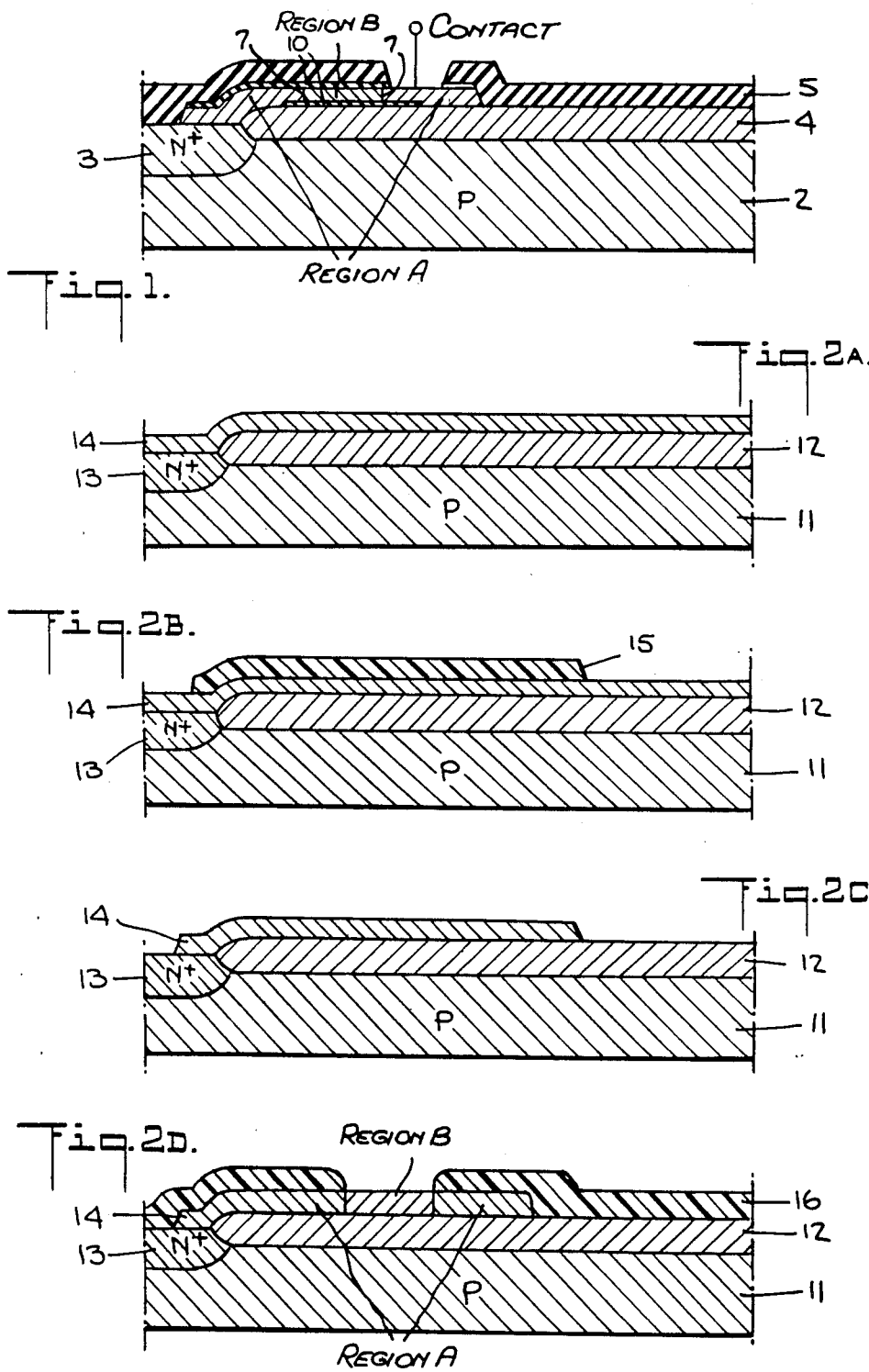

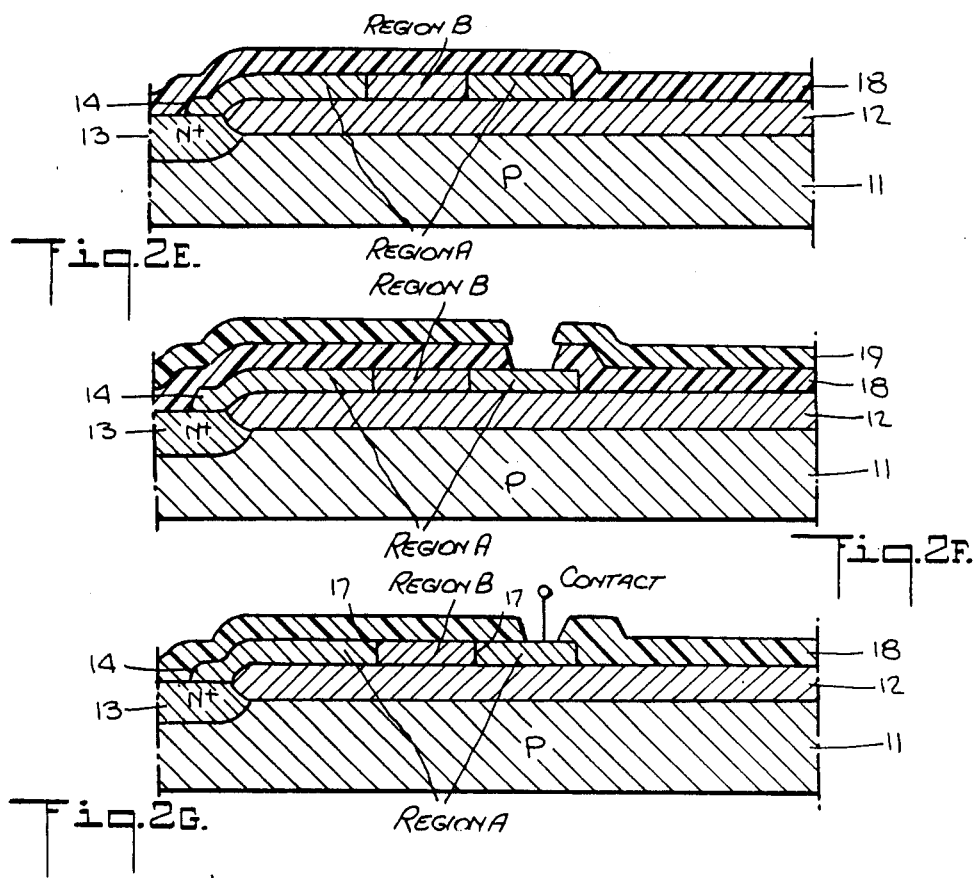
Fig. 2E.
Fig. 2F.
Fig. 2G.
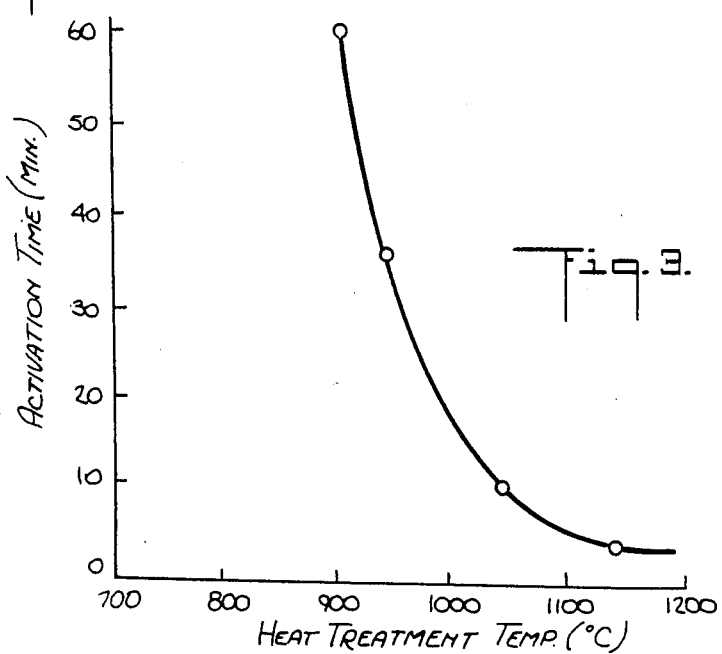
Fig. 3.

POLYCRYSTALLINE SILICON RESISTOR HAVING LIMITED LATERAL DIFFUSION

This is a continuation of co-pending application Ser. No. 663,155 filed on Oct. 22, 1984, now abandoned which in turn is a divisional of U.S. patent application Ser. No. 500,613, filed June 3, 1983, now U.S. Pat. No. 4,489,104, issued Dec. 18, 1984.

BACKGROUND OF THE INVENTION

As the demand for increasing the circuit densities of VLSI products continues to grow, it becomes imperative to more precisely control the physical size of both the active and inactive components with greater precision. The current technology has progressed to the extent that it is now possible to form integrated circuit chips having hundreds of thousands of components on chip areas only a few millimeters square. See, for example, T. Ohzone, J. Yasui, T. Ishihara and S. Horiuchi, "An 8K×8 Bit Static MOS RAM Fabricated by n-MOS/n-Well CMOS Technology", *IEEE Journal of Solid-State Circuits*, Vol. SC-15, No. 5, Oct. 1980, pp. 854–861. Ingenious methods have been employed not only to reduce the size of the components, but also to form multilayer devices which are carefully designed to increase the packing density on the chips.

In the foregoing circuits, particularly in the form of memory cells, polysilicon resistors are now commonly used, because of their compatibility with monolithic silicon technology and the wide range of resistance values which can be achieved. See particularly N. C. Lu, L. Gerzberg, C.-Y. Lu, and J. D. Meindl, "Modeling and Optimization of Monolithic Polycrystalline Silicon Resistor", *IEEE Transactions on Electron Devices*, Vol. ED-28, No. 7, July 1981, pp. 818–830. Such resistors are easily fabricated, generally atop of the polysilicon gate of the MOS field effect transistors or in the isolation regions of bipolar transistors. In the fabrication of the memory cells or other devices incorporating polysilicon transistors, particularly as dimensions become more and more critical, certain problems become apparent. Firstly, because of the grain size of polysilicon and the high concentration gradient of the polysilicon layer with respect to contiguous areas, the lateral diffusion of dopants during the high temperature fabrication steps is greater than desired. In order to compensate for this diffusion, it is necessary to increase the distance between the polysilicon resistor and its neighboring components, thereby decreasing circuit density. Another approach to minimize this problem is to form barriers around the resistor with materials such as silicon nitride or thermally grown polysilicon oxide, thereby promoting process control and resistor reliability. But this approach complicated manufacture. Still further, the lateral diffusion problem makes resistivity difficult to control. To overcome these problems, much theoretical and practical work has been done to better understand the physical and electrical properties of polysilicon. See J. Seto, "The Electrical Properties of Polycrystalline Silicon Films", *J. Appl. Phys.*, Vol. 46, No. 12, Dec. 1975, pp. 5247–5254; J. Seto, "Annealing Characteristics of Boron- and Phosphorus-Implanted Polycrystalline Silicon", *J. Appl. Phys.*, Vol. 47, No. 12, Dec. 1976, pp. 5167–5170; G. Baccarani, B. Ricco and G. Spadini, "Transport Properties of Polycrystalline Silicon Films", *J. Appl. Phys.*, Vol. 49, No. 11, Nov. 1978, pp. 5565–5570; and T. Yoshihara, A. Yasuoka, and H. Abe, "Conduction Properties of Chemically Deposited Polycrystalline Silicon", *J. Electrochem. Soc.*, Vol. 127, No. 7, July 1980, pp. 1603–7. Despite these extensive studies, the aforesaid problems have not been adequately resolved.

FIG. 1 illustrates the cross-section of a conventionally fabricated polysilicon resistor. This structure consists of a p-type silicon substrate 2, a field oxide layer 4, an n+ region 3, and a phosphorosilicate glass layer (PSG) 5. In addition, regions A and B define a polysilicon layer, region B being the resistor region. These regions are formed by first doping the entire polysilicon layer to establish an initial bulk conductivity of polysilicon which corresponds to the desired low conductivity of the resistor. Generally, this would be a doping concentration of less than $2 \times 10^{16}/cm^3$. Thereafter, the resistor region B is masked with a protective resistor oxide and region A is again exposed to a doping agent to render it highly conductive. The final doping concentration in region A is at least $5 \times 10^{19}/cm^3$. Junctions 7 represent the lateral boundaries of the regions. (The conventional procedure used in the prior art to form polysilicon resistors is exemplified in Texas Instruments U.S. Pat. No. 4,139,786; Intel U.S. Pat. No. 4,178,674; and EMM Semi U.S. Pat. No. 4,214,917, the latter of which discusses the undesirability of dopant migration.)

In order to limit the diffusion of the dopants and to ensure good process control for resistivity, the silicon nitride layers 10 are deposited to isolate the polysilicon resistor region B from the PSG 5 and the field oxide layer 4.

BRIEF DESCRIPTION OF THE INVENTION

In order to overcome the foregoing problems, in accordance with the instant invention it has been discovered that a polysilicon resistor having limited lateral diffusion can be prepared by the application of the n-p neutralization concept. More specifically, a resistor is described which maintains fixed dimensions even in the presence of high temperatures and other high energy thermal treatments. The fabricated polysilicon resistor has sheet resistivity of from about $10^8$ to $10^{10}$ ohms/square, a low temperature coefficient and an activation energy of about 0.2 to 0.3 electron volts.

FIG. 1 is an illustration of a conventional semiconductor device incorporating a polysilicon resistor.

FIGS. 2a–2g shows the fabrication of a polysilicon resistor in accordance with the instant invention in a semiconductor device.

FIG. 3 is a graph of the minimum time period required for heat treatment with respect to temperature to completely activate the neutralization reaction.

In brief compass, in order to obtain the polysilicon resistor having the characteristics described, a specified amount of n-type dopant, generally at least $10^{18}$ atoms/cm$^3$, is first incorporated into the polysilicon layer. Thereafter a specified amount of p-type dopant, generally an amount substantially equal to the n-type dopant, is incorporated in the resistor region of this layer. The thus-treated film is thereafter heat-treated, i.e., annealed at a specified high temperature, during which time the n- and the p-type dopants chemically react to give the resistor region its semi-insulating characteristics. For simplicity, in describing the manufacture of the polysilicon resistor, the initial dopant used is the n-type and a p-type is used for neutralization. It will be understood by those skilled in the art that this sequence may be reversed, i.e., the initial dopant can be of the p-type and the second dopant of the n-type.

DETAILED DESCRIPTION OF THE INVENTION

The preferred process of the invention is illustrated in FIG. 2. FIG. 2a shows an intermediate structure which can be formed according to conventional practices. Illustrated thereon is a p-type silicon substrate 11, an n+ region 13, and a field oxide layer 12, having thereon a polysilicon film 14. The field oxide layer may be deposited using local oxidation of silicon (LOCOS) and the polysilicon film 14 by low pressure chemical vapor deposition (LPCVD) or atmospheric pressure chemical vapor deposition (APCVD), in accordance with techniques known to the art.

The polysilicon film 14 is then blanketly doped with phosphorus as the n+ dopant using ion implantation to a dopant concentration of $1 \times 10^{20}/cm^3$. After this initial doping step, the polysilicon film is coated by a CVD silicon oxide film and the substrate is annealed at a temperature of 1000° C. for fifteen minutes, a time sufficient to activate the implanted impurity atoms. Temperatures of 600° to 1200° C. may be used for the first annealing step. See J. Seto, "Annealing Characteristics of Boron- and Phosporous-Implanted Polycrystalline Silicon," supra.

FIG. 2b shows the addition of an etching mask 15 which is used to pattern the polysilicon film 14. After the removal of the etching mask 15 as shown in FIG. 2c, an implantation mask 16 is developed, defining the region B which is thereafter implanted with boron as the p dopant. The configuration of the substrate during the ion implantation step is shown in FIG. 2d. The ion implantion forms the resistor region B having a length of five microns, a width of five microns and a thickness of 5000 angstroms, it being controlled so that the concentration of the p dopant is about equal to the concentration of the n dopant initially applied to the polysilicon film.

Thereafter the implantation mask is stripped by plasma ashing. Alternatively, wet chemical techniques may be used. A 2 to 4% CVD phosphorous-silicon dioxide film 18 is deposited to serve as a dielectric barrier, as shown in FIG. 2e, to protect the circuitry against moisture and short circuits. The thus-fabricated substrate is heat-treated at a temperature of 1000° C. for fifteen minutes to neutralize the n and p dopant in the resistor region B. The selection of the appropriate time and temperature can be readily determined by those skilled in the art by reference to FIG. 3.

FIG. 2f shows an etching mask 19 used to provide contact of the polysilicon layer with the outside world. The finished device is shown in FIG. 2g, wherein the etching mask 19 has been removed and the contact to the polysilicon layer 14 formed. FIG. 2g shows the final structure in accordance with the invention. The thus fabricated polysilicon resistor has a sheet resistivity of $10^{10}$ ohms/square. Examination of the junctions 17 evidences substantially no lateral diffusion.

In the above procedure, the lateral diffusion phenomenon can be effectively limited because there is no concentration gradient between the heavily doped areas region A and the resistor region B. Since the concentration of p dopant in the resistor region is controlled to be equal to or slightly less than the concentration of n+ dopant, the p atoms are wholly reacted with n+ dopant and therefore the migration of p atoms across the junctions 17 at elevated temperatures from the resistor region B to the heavily doped n+ areas (region A) cannot easily occur.

Preferably, the doping processes are all performed using ion implantation to precisely control the doping concentration of polysilicon film. Other conventional doping methods, however, such as thermal diffusion, spin-on drive-in or CVD drive-in, though less preferred, may also be used. The initial doping n+ concentration is about $1 \times 10^{20}/cm^3$ and the latter doping p concentration is equal to or slightly less than $1 \times 10^{20}/cm^3$. The concentration difference between n+ and p dopants should not be greater than $1 \times 10^{18}/cm^3$ to obtain a resistivity up to $10^{10}$ ohms per square. This difference, of course, affects the resistivity of the fabricated resistor. Another factor to affect the resistivity is the heat-treatment process. Preferably, the heat-treatment for the doped polysilicon film is carried out in a non-oxidizing atmosphere, that is, in an atmosphere of an inert gas such as $N_2$, He, Ne, Ar, Kr or Xe to ensure that only a thin surface layer of said doped polycrystalline silicon film is oxidized. This heat-treatment temperature after the second doping step is from 900° C. to 1150° C. for a period of from 3 to 60 minutes. In order to obtain a wholly activated resistor, the heat-treatment time is performed under the conditions shown in FIG. 3. For 900° C. heat-treatment, a period of 60 minutes is necessary to wholly activate the resistor; however, for 1100° C. heat-treatment, a period of only 5 minutes is enough.

A laser, xenon lamp, electron beam, ion beam or other optical methods are also available for activating the doubly doped polysilicon film.

For practical application in integrated circuit manufacturing, this invention provides a method to fabricate the polisilicon resistor with high resistivity as about $10^{10}$ ohms per square and low activation energy as 0.2-0.3 eV. This low activation energy results in highly reliable characteristics compared to the activation energy of 0.5-0.6 eV for $10^{10}$ ohms per square polysilicon resistors prepared by the prior art processes. Activation energy relates to resistivity. This is described in the articles by N. C. Lu et al. and the John Y. W. Seto article, "The Electrical Properties of Polycrystalline Silicon Films" cited above.

While the foregoing description describes the n-type dopant as phosphorous, it will be understood that other Group V compounds such as antimony, arsenic, bismuth or nitrogen may also be used. Similarly, in addition to boron, Group III-type compounds such as aluminum, gallium, indium or thallium may be used as the p-type dopant.

The insulated substrate may be thermally grown silicon oxide on silicon, deposited silicon oxide on silicon, deposited silicon oxide on a sapphire-substrate, or, for that matter, silicon oxide or aluminum oxide on substantially any substrate or insulated material. The semiconductor material may be silicon, germanium, tin, lead or carbon, or binary systems consisting of elements of Group III and V and of Group II and VI compounds, e.g., aluminum phosphide, gallium arsenide, gallium phosphide, and indium antimonide. The foregoing materials are useful semiconductors so long as they retain the diamond cubic or zinc blende lattice structure.

The polysilicon layer may be heat-treated prior to the doping step; however, this is not essential. Preferably, a silicon oxide film is deposited on the doped polysilicon layer prior to heat-treating in an oxidizing atmosphere.

The particular model of heat-treating used in the invention is not critical. Heat-treating may be accomplished by application of laser, xenon lamp, ion beams or electron beams. Such heat sources are well known to those skilled in the art.

I claim:

1. A polysilicon resistor containing a concentration of at least $10^{18}/cm^3$ of both p-type and n-type dopants, the concentration of one of said dopants being equal to or less than the concentration of the other, said p-type dopant being boron, aluminum, gallium or indium, said n-type dopant being phosphorus, antimony or arsenic, and said resistor having a low activation energy and a sheet resistivity of $10^8$–$10^{10}$ ohms/square.

2. The polysilicon resistor of claim 1 wherein the n-type dopant is phosphorous and the p-type dopant is boron.

3. A polysilicon structure comprising a polysilicon resistor region as described in claim 1 and highly conductive polysilicon regions adjacent thereto.

4. An integrated circuit comprising the polysilicon resistor of claim 1.

* * * * *